(12) United States Patent
Rayaprolu et al.

(10) Patent No.: US 11,797,216 B2
(45) Date of Patent: Oct. 24, 2023

(54) READ CALIBRATION BASED ON RANGES OF PROGRAM/ERASE CYCLES

(71) Applicant: Micron Technology, Inc., Boise, ID (US)

(72) Inventors: Vamsi Pavan Rayaprolu, San Jose, CA (US); Giuseppina Puzzilli, Boise, ID (US); Karl D. Schuh, Santa Cruz, CA (US); Jeffrey S. McNeil, Jr., Nampa, ID (US); Kishore K. Muchherla, Fremont, CA (US); Ashutosh Malshe, Fremont, CA (US); Niccolo' Righetti, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/867,489

(22) Filed: Jul. 18, 2022

(65) Prior Publication Data

US 2022/0350520 A1    Nov. 3, 2022

Related U.S. Application Data (62) Division of application No. 17/001,729, filed on Aug. 25, 2020, now Pat. No. 11,392,312.

(51) Int. Cl.
| | |
|---|---|
| *G06F 3/06* | (2006.01) |
| *G11C 11/56* | (2006.01) |
| *G11C 16/34* | (2006.01) |
| *G11C 29/50* | (2006.01) |

(52) U.S. Cl.
CPC .......... *G06F 3/0652* (2013.01); *G06F 3/0604* (2013.01); *G06F 3/0619* (2013.01); *G06F 3/0649* (2013.01); *G06F 3/0653* (2013.01); *G06F 3/0679* (2013.01);
(Continued)

(58) Field of Classification Search
CPC ..... G11C 16/3418; G11C 16/14; G11C 16/26; G11C 16/349; G11C 16/3495; G11C 29/10; G11C 29/50–50016; G11C 11/5642; G11C 2029/5002–5006; G06F 12/0253; G06F 2212/7211; G06F 3/0652;
(Continued)

(56) References Cited

U.S. PATENT DOCUMENTS

| | | |
|---|---|---|
| 7,453,731 B2 | 11/2008 | Tu et al. |
| 7,593,259 B2 | 9/2009 | Kim |
| 7,692,970 B2 | 4/2010 | Park et al. |

(Continued)

*Primary Examiner* — Curtis James Kortman
(74) *Attorney, Agent, or Firm* — Brooks, Cameron & Huebsch, PLLC (57) ABSTRACT

A signal associated with performance of a memory operation can be applied to a memory cell of a first group of memory cells that have undergone PECs within a first range. The signal can have a first magnitude corresponding to a second range of PECs. Whether differences between a first target voltage and the signal and between a second target voltage and the applied signal are at least the threshold value can be determined. Responsive to determining that the differences are at least the threshold value, the first group of memory cells can be associated with a first calibration cluster and the signal having a second magnitude corresponding to a third range of PECs can be applied to a memory cell of a second group of memory cells that have undergone respective quantities of PECs within the second range.

11 Claims, 7 Drawing Sheets

(52) U.S. Cl.
 CPC ........ *G11C 11/5642* (2013.01); *G11C 16/349* (2013.01); *G11C 29/50004* (2013.01)

(58) Field of Classification Search
 CPC .... G06F 3/0604; G06F 3/0619; G06F 3/0649; G06F 3/0653; G06F 3/0679
 See application file for complete search history.

(56) References Cited

U.S. PATENT DOCUMENTS

| | | | |
|---|---|---|---|
| 8,036,044 | B2 | 10/2011 | Dong et al. |
| 8,995,197 | B1 | 3/2015 | Steiner |
| 9,047,955 | B2 * | 6/2015 | Cometti ................. G11C 16/06 |
| 9,164,836 | B2 | 10/2015 | Guo et al. |
| 9,330,784 | B2 | 5/2016 | Pangal et al. |
| 9,514,823 | B2 * | 12/2016 | Melik-Martirosian ...................... G11C 16/10 |
| 9,857,992 | B2 | 1/2018 | Pangal et al. |
| 2013/0080691 | A1 | 3/2013 | Weingarten |
| 2014/0047302 | A1 * | 2/2014 | Guo ....................... G11C 16/26 714/773 |
| 2015/0113207 | A1 * | 4/2015 | Shin .................... G06F 12/0246 711/103 |
| 2019/0096487 | A1 * | 3/2019 | Nishikawa ............. G11C 16/32 |
| 2020/0233739 | A1 * | 7/2020 | Oh ..................... G06F 11/0793 |

* cited by examiner

READ CALIBRATION BASED ON RANGES OF PROGRAM/ERASE CYCLES

PRIORITY INFORMATION

This application is a Divisional of U.S. application Ser. No. 17/001,729, filed Aug. 25, 2020, the contents of which are included herein by reference.

TECHNICAL FIELD

Embodiments of the disclosure relate generally to memory systems and more specifically relate to read calibration of a memory device based on ranges of program/erase cycles (PECs).

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

Aspects of the present disclosure are directed to read calibration of a memory device based on program/erase cycles (PECs) that the memory device has undergone. The memory device can be operated using different trims corresponding to different quantities and/or ranges of PECs. As used herein, a "trim" or "trim set" generally refers to a set of parameters, such as magnitudes of voltages, differentials, currents, etc. that can be applied to a memory device (via word line and/or bit lines, for example) to operate the memory device (control access to data written to the memory device, for example). A media management operation, such as a wear leveling operation can be performed in response to memory cells undergoing particular quantities of PECs, which can be referred to as a wear leveling window. For example, wear leveling can be performed on a group of memory cells at a wear leveling window of 50,000 PECs (50,000 PECs; 100,000 PECs; 150,000 PECs; etc.) undergone by the group of memory cells.

Some approaches rely on performing such media management operations based on solely on characteristics associated with a particular wear leveling window. However, trims with which the group of memory cells is operated (e.g., programmed) can be changed (modulated) at a different frequency than the wear leveling windows. For example, trims can be changed every 10,000 PECs (10,000 PECs; 20,000 PECs; 30,000 PECs; etc.) undergone by the group of memory cells. Thus, memory cells of a memory device can be operated with multiple trims within a wear leveling window.

Aspects of the present disclosure address the above and other deficiencies by performing a media management operation on memory cells of a memory device based on a quantity of PECs that the memory cells have undergone. Based on the result of the media management operation, groups of memory cells can be associated with read levels. For example, by calibrating one or more groups of memory cells of a memory device that have undergone same or similar quantities of PECs challenges associated with disconnects between wear leveling windows and modulation of trims can be mitigated.

Figure 1:
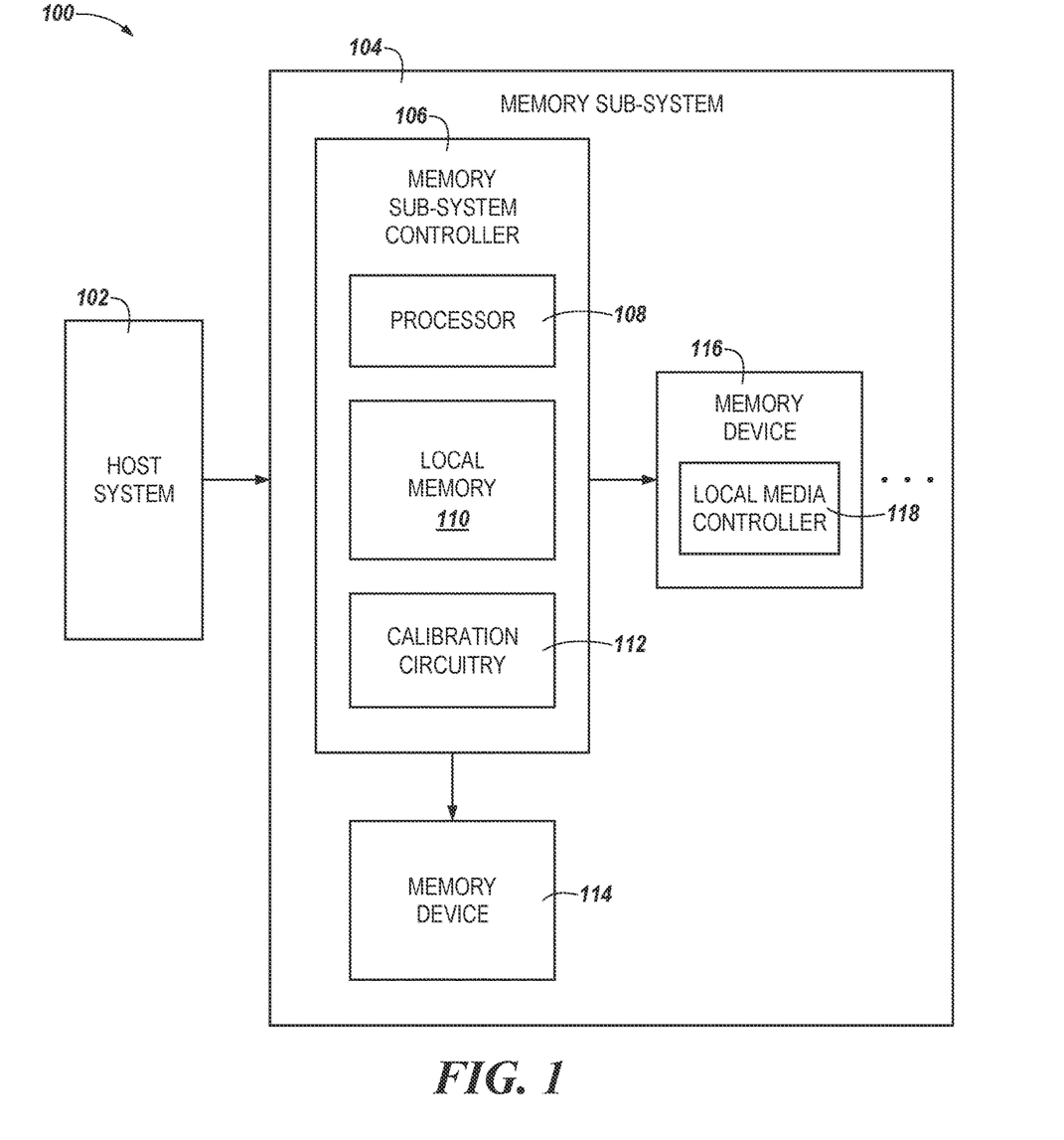
FIG. 1 illustrates an example computing system that includes a memory sub-system in accordance with some embodiments of the present disclosure.

FIG. 1 illustrates an example computing system 100 that includes a memory sub-system 104 in accordance with some embodiments of the present disclosure. The memory sub-system 104 can include media, such as one or more volatile memory devices (e.g., memory device 114), one or more non-volatile memory devices (e.g., memory device 116), or a combination of such.

A memory sub-system 104 can be a storage device, a memory module, or a hybrid of a storage device and memory module. Examples of a storage device include a solid state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), such computing device that includes memory and a processing device.

The computing system 100 includes a host system 102 that is coupled to one or more memory sub-systems 104. In some embodiments, the host system 102 is coupled to different types of memory sub-systems 104. FIG. 1 illustrates one example of a host system 102 coupled to one memory sub-system 104. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. In at least one embodiment, the host system 102 is a computing device that controls a vehicle, such as an autonomous vehicle, and the memory sub-system 104 is an SSD that provides event recorder storage for the vehicle. An event recorder can also be referred to as a "black box" or accident data recorder. The memory sub-system 104 can store time based telemetric sensor data for the vehicle; however, embodiments are not limited to this example.

The host system 102 can include a processor chipset and a software stack executed by the processor chipset. The processor chipset can include one or more cores, one or more caches, a memory controller (e.g., an SSD controller, NVDIMM controller, etc.), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access the non-volatile memory device 116 when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The memory devices 114 and 116 can include any combination of the different types of non-volatile memory devices and/or volatile memory devices. The volatile memory devices (e.g., memory device 114) can be, but are not limited to, random access memory (RAM), such as dynamic random-access memory (DRAM) and synchronous dynamic random access memory (SDRAM).

Some examples of non-volatile memory devices (e.g., memory device 116) include negative-and (NAND) type flash memory and write-in-place memory, such as three-dimensional cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 114 and 116 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 116 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 116 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 106 (or controller 106 for simplicity) can communicate with the non-volatile memory devices 116 to perform operations such as reading data, writing data, erasing data, and other such operations. The memory sub-system controller 106 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processor 108 (e.g., a processing device) configured to execute instructions stored in local memory 110. In the illustrated example, the local memory 110 of the memory sub-system controller 106 is an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc. The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive information or operations from the host system 102 and can convert the information or operations into instructions or appropriate information to achieve the desired access to the non-volatile memory device 116 and/or the volatile memory device 114. The memory sub-system controller 106 can be responsible for other operations such as wear leveling operations, error detection and/or correction operations, encryption operations, caching operations, and address translations between a logical address (e.g., logical block address (LBA)) and a physical address (e.g., physical block address (PBA)) associated with the non-volatile memory device 116. The memory sub-system controller 106 can further include host interface circuitry to communicate with the host system 102 via the physical host interface. The host interface circuitry can convert a query received from the host system 102 into a command to access the non-volatile memory device 116 and/or the volatile memory device 114 as well as convert responses associated with the non-volatile memory device 116 and/or the volatile memory device 114 into information for the host system 102.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be an LBA, which can include or be accompanied by a partition number. The logical address information is the location the host system associates with the host data. The logical address information can be part of metadata for the host data. The LBA can also correspond (e.g., dynamically map) to a physical address, such as a PBA, that indicates the physical location where the host data is stored in memory.

The memory sub-system 104 can also include additional circuitry or components that are not illustrated. In some embodiments, the memory sub-system 104 can include a cache or buffer (e.g., DRAM) and address circuitry (e.g., a row decoder and a column decoder) that can receive an address from the memory sub-system controller 106 and decode the address to access the memory device 114 and/or the memory device 116.

In some embodiments, the memory device 116 includes a local media controller 118 that operates in conjunction with memory sub-system controller 106 to execute operations on one or more memory cells of the non-volatile memory device 116. An external controller (e.g., memory sub-system controller 106) can externally manage the memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND device.

In some embodiments, the memory sub-system controller 118 includes at least a portion of the calibration circuitry 112. For example, the memory sub-system controller 118 can include a processor 108 (e.g., a processing device) configured to execute instructions stored in local memory 110 for performing the operations described herein. In some embodiments, the calibration circuitry 112 is part of the host system 102, an application, or an operating system.

In some embodiments, the calibration circuitry 112 can issue, or cause to be issued, a set trim command, which causes the memory device 116 (or portions thereof, such as logical units) to use a particular set of operating parameters to operate the memory cells of the memory device 116. Trims can include operating parameters associated with various operations such as program (write), program verify, erase, erase verify, and sense (read), among other operations associated with memory cells.

Trims can be used to achieve or adjust desired target voltages for programming memory cells, which can create different threshold voltage ($V_t$) distributions for data states. Trims can be used to achieve a read window or adjust a read window between data states (e.g., the voltage spread between different $V_t$ distributions for different data states for memory cells of the memory device 116). Different trims can be used for different operations such as programming, reading, and/or erasing.

Examples of trims include programming voltages, programming frequency, a program start voltage, a program step voltage, a program inhibit start voltage, and an erase verify voltage. The program start voltage is the magnitude of an initial programming voltage pulse of a series of voltage pulses applied to a selected word line during a programming operation performed on memory cells in a selected block. The program step voltage is the voltage step size between programming voltage pulses. The program inhibit start voltage is a voltage used to inhibit further programming of memory cells once the $V_t$ associated with a desired data state has been reached. The erase verify voltage is the voltage used to check whether memory cells in the selected block have a $V_t$ indicative of the erase state.

Other examples of trims include read reference voltages and/or program verify voltages. Program verify voltages represent target voltage levels to which memory cells are to be programmed in order to represent a particular data state. Read reference voltages are voltage levels that can be located between program Vt distributions and used to determine a particular data state of a data cell during a data read operation. As used herein, trims are distinguished from programming times. The following description of some example functionality of the calibration circuitry 112 is described in association with FIG. 5.

Groups of memory cells of the non-volatile memory device 116 can undergo different quantities of PECs throughout the service life of the non-volatile memory device 116. A group of memory cells can be a physical block of memory cells. The calibration circuitry 112 can be configured to perform a media management operation on a group of memory cells of the non-volatile memory device 116 that has undergone various quantities of PECs. A magnitude of a signal (e.g., a magnitude of a read voltage) this is applied to the group of memory cells during the media management operation can be based on in which range of PECs (e.g., 0 to 10,000 PECs, 10,001 to 20,000 PECs, etc.) that the quantities of PECs undergone by the group of memory cells lie. The magnitude of the signal can correspond to a different range of PECs that exceeds the range of PECs undergone by the group of memory cells. For example, if the group of memory cells has undergone no more than 10,000 PECs (within the range of 0 to 10,000 PECs), then the magnitude of the signal can correspond to a range of PECs exceeding 10,000 PECs (e.g., 10,001 to 20,000 PECs).

In response to a successful result of the media management operation, the media management operation can be performed on a different group of memory cells of the non-volatile memory device 116 that has undergone a quantity of PECs within a range of PECs that exceeds the range of PECs undergone by the previous group of memory cells (e.g., 10,001 to 20,000 PECs). A magnitude of the signal with which the media management operation is performed on the other group of memory cells can correspond to a range of PECs exceeding the range of PECs of the other group of memory cells (e.g., 20,001 to 30,000 PECs). In response to an unsuccessful result of the media management operation on the group of memory cells, the media management operation can be performed on the other group of memory cells using a voltage of the same magnitude with which the media management operation was performed on the group of memory cells.

The calibration circuitry 112 can be configured to, in response to a successful result of performing the media management operation on the different group of memory cells, perform the media management operation on another group of memory cells of the non-volatile memory device 116 that has undergone a quantity of PECs within the range of PECs of the different group of memory cells. A magnitude of the signal with which the media management operation is performed can correspond to a range of PECs exceeding the range of PECs of the other group of memory cells (e.g., 30,001 to 40,000 PECs). The calibration circuitry 112 can be configured to, in response to an unsuccessful result of the media management operation, perform the media management operation on the other group of memory cells. A magnitude of the signal with which the media management operation is performed can be the same magnitude as with which the media management operation was performed on the different group of memory cells.

The calibration circuitry 112 can execute instructions to utilize different trims on different groups of memory cells where the trims are based on a quantity of PECs undergone by a respective group of memory cells. For example, the calibration circuitry 112 can execute instructions to selectively vary a magnitude of a target voltage corresponding to a particular data state based on a quantity of PECs that the non-volatile memory device 116 has undergone. The calibration circuitry 112 can execute instructions to, throughout a service life of the non-volatile memory device 116, increase a read window of one or more memory cells of the non-volatile memory device 116 based on the quantity of PECs that the non-volatile memory device 116 has undergone. A magnitude of a target voltage corresponding to a different data state can be static throughout the service life of the non-volatile memory device 116. The magnitude of the target voltage corresponding to the particular data state can be dynamic such that the magnitude of the target voltage is increased based on the quantity of PECs that the memory device has undergone. The calibration circuitry 112 can execute instructions to program one or more memory cells of the non-volatile memory device 116 such that one or more memory cells of the non-volatile memory device 116 remains at a $V_t$ corresponding to an erased state, and one or more memory cells of the memory device is programmed to a different $V_t$ corresponding to a programmed state. A magnitude of the different $V_t$ can be increased, over the service life of the non-volatile memory device 116, based on the quantity of PECs that the non-volatile memory device 116 has undergone.

Figure 2:
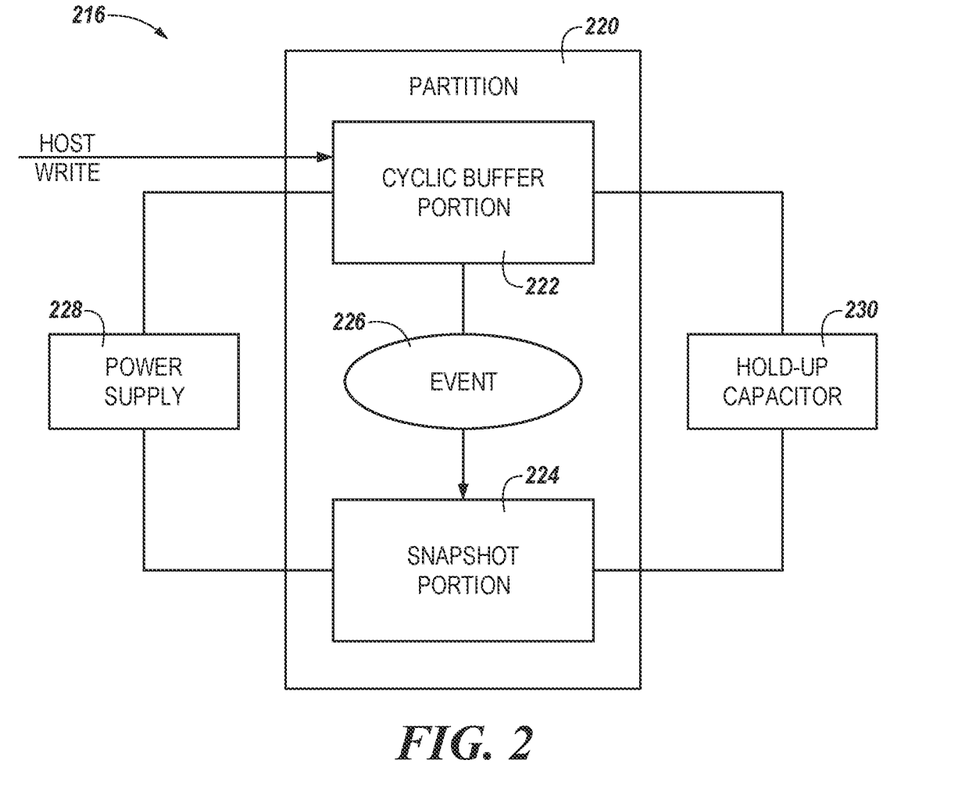
FIG. 2 illustrates an example of a partition including a cyclic buffer portion and a snapshot portion within a memory device in accordance with some embodiments of the present disclosure.

In at least one embodiment of the present disclosure, the non-volatile memory device 116 can include a cyclic buffer portion (e.g., the cyclic buffer portion 222 illustrated by FIG. 2) and a snapshot portion (e.g., the snapshot portion 224 illustrated by FIG. 2). The calibration circuitry 112 can execute instructions to utilize different trims with different groups of memory cells of the snapshot portion based on a quantity of PECs.

FIG. 2 illustrates an example of a partition 220 including a cyclic buffer portion 222 and a snapshot portion 224 within a memory device 216 in accordance with some embodiments of the present disclosure. The cyclic buffer portion 222 and snapshot portion 224 can be reserved portions of the partition 220. Host data can be received by the memory sub-system. The host data can be time based telemetric sensor data from different sensors of a vehicle. The time based telemetric sensor data from the different sensors can be aggregated by the host and sent to the memory sub-system at a data rate. The host data can be received by the memory sub-system and stored in the cyclic buffer portion 222 of the non-volatile memory device 216. As the cyclic buffer portion 222 is filled with host data, new data received from the host is stored sequentially, but older data in the cyclic buffer portion 222 can be erased or overwritten. The cyclic buffer portion 222 can therefore operate as a first-in-first-out (FIFO) buffer, where newly received data replaced the oldest data therein.

The cyclic buffer portion 222 can be coupled to the snapshot portion 224. Upon occurrence of a trigger event 226, an amount of the time based telemetric sensor data from the cyclic buffer portion 222 can be copied to the snapshot portion 224. The recorded telemetric sensor data corresponding to the predetermined playback time can be referred to as a "snapshot". The amount of host data corresponding to a defined period of time, which may be referred to as a playback time (e.g., 30 seconds), is referred to as a snapshot size whereas the data itself over that defined period of time is referred to as a snapshot. The snapshot size can be predefined for a period of time immediately preceding a trigger event. The snapshot size and/or playback time can be a predefined value programmed to the memory sub-system by a manufacturer, supplier, or user of the memory sub-system. In some embodiments, the determination that the trigger event 226 has occurred can include actuation of a trigger signal based at least in part upon received sensor information from a host that is above a threshold, such as a quantitative value.

The cyclic buffer portion 222 can store significantly more data over the service life of the memory device 216 than the snapshot portion 224. For example, the cyclic buffer portion 222 can store 3-4 orders of magnitude (1,000-10,000 times) more data than the snapshot portion 224. However, the cyclic buffer portion 222 does not have a greater storage capacity than the snapshot portion 224. Rather, the size (amount of memory) of the snapshot portion 224 can be based on the rate at which data is to be received from the host, a playback time, and a quantity of snapshots that are desired to be available in the snapshot portion 224. The snapshot portion 224 can have sufficient storage to save [data rate from host (e.g., in GB/sec)*playback time (e.g., in sec)*desired quantity of snapshots (e.g., a whole number)]. In other words, the size of the snapshot portion 224 can be sufficiently large to store a desired number of snapshots. As used herein, the size of the snapshot portion 224 is referred to as "a user capacity" of the memory sub-system.

The memory sub-system can be configured to operate the snapshot portion 224 such that memory cells of the snapshot portion 224 are programmed to a $V_t$ based on a remaining service life of the memory sub-system. It is desirable for the snapshot portion 224 to store data accurately and reliably because the snapshots are intended to be recoverable after a trigger event. Thus, a performance target of the snapshot portion 224 can be data retention. However, embodiments of the present disclosure are not so limited. For example, the memory sub-system can be configured to operate the cyclic buffer portion 222 such that memory cells of the cyclic buffer portion 222 are programmed to a $V_t$ based on a remaining service life of the memory sub-system. It is desirable for the cyclic buffer portion 222 to store data accurately and reliably because the cyclic buffer portion 222 is used repeatedly and frequently (in some embodiments, significantly more frequently than the snapshot portion 224). Thus, a performance target of the cyclic buffer portion 222 can be data retention.

The copying of a snapshot from the cyclic buffer portion 222 to the snapshot portion 224 can be powered by a power supply 228 of the memory sub-system under normal circumstances. However, copying of the snapshot from the cyclic buffer portion 222 to the snapshot portion 224 can be powered by a backup power supply, such as one or more hold-up capacitors 230 in response to a loss of system power (e.g., the power supply 228), which can be associated with the trigger event 226, such as a vehicle accident. In at least one embodiment, the loss of power from the power supply 228 can be the trigger event 226. A size and/or quantity of the hold-up capacitor(s) 230 are sufficient to provide enough power to copy one snapshot from the cyclic buffer portion 222 to the snapshot portion 224. As illustrated, the power supply 228 and the hold-up capacitor 230 are coupled to the cyclic buffer portion 222 and the snapshot portion 224. This indicates that the power supply 228 and the hold-up capacitor 230 are coupled to the memory device 216 to provide power therefor. There may not be a direct physical connection between either the power supply 228 or the hold-up capacitor 230 and the partition 220, but the power can be provided through write circuitry (not specifically illustrated).

In some embodiments, memory cells of the cyclic buffer portion 222 can be operated so as to store one bit per cell (SLC mode) and memory cells of the snapshot portion 224 can be operated so as to store more than one bit per cell. It can take longer to operate memory cells that store more than one bit per cell than to operate memory cells that store only one bit per cell. For example, an increased number of data states represented by the memory cells having multiple bits per cell can further increase complexity of an algorithm associated with programming, reading, and/or erasing the memory cells. Therefore, the memory cells programmed to store multiple bits per cell can have a different programming characteristic, such as a slower data transfer rate and/or longer programming time (e.g., time elapsed to program data to the memory cells), than that of the SLC memory cells and/or memory cells programmed to store fewer bits per cell. Memory cells of the cyclic buffer portion 222 can be operated with a faster programming time than a programming time for the memory cells of the snapshot portion 224.

Figure 3:
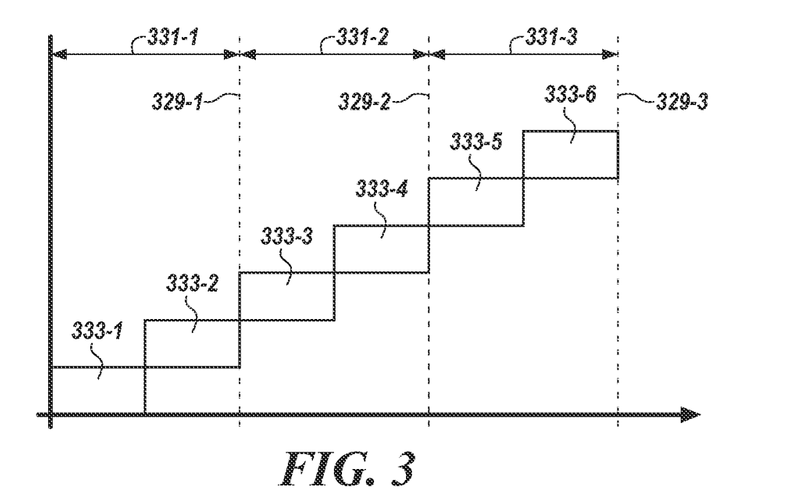
FIG. 3 illustrates a relationship between quantities of PECs undergone by groups of memory cells of a memory device and wear leveling windows.

FIG. 3 illustrates a relationship between quantities of PECs undergone by groups of memory cells of a memory device and wear leveling windows 331-1, 331-2, and 331-3. Each of the rectangles 333-1, 333-2, 333-3, 333-4, 333-5, and 333-6 represents a range of PECs. For example, the rectangle 333-1 can represent 0 to 10,000 PECs, the rectangle 333-2 can represent 10,001 to 20,000 PECs, the rectangle 333-3 can represent 20,001 to 30,000 PECs, the rectangle 333-4 can represent 30,001 to 40,000 PECs, the rectangle 333-5 can represent 40,001 to 50,000 PECs, and the rectangle 333-6 can represent 50,001 to 60,000 PECs. In at least one embodiment, trims used to perform programming operations, for example, on respective groups of memory cells of the memory device can be based on a quantity of PECs that each respective group of memory cells has undergone. For instance, if a group of memory cells has undergone no more than 10,000 PECs (represented by the rectangle 333-2), then trims used to program the group of memory cells can correspond to the range of 0 to 9,999 PECs. If a group of memory cells has undergone no more than 20,000 PECs but at least 10,001 PECs (represented by the rectangle 333-3), then trims used to program the group of memory cells can correspond to the range of 10,001 to 20,000 PECs.

The vertical, dashed lines 329-1, 329-2, and 329-3 represent boundaries of the wear leveling windows 331-1, 331-2, and 331-3. Wear leveling windows can span a different range of PECs than the ranges of PECs on which trims are based. For example, trims can be based on ranges of PECs that span 10,000 PECs whereas wear leveling windows can span a range of 100,000 PECs. As illustrated by FIG. 3, ranges of PECs on which trim selection can be based are within different wear leveling windows. For example, the rectangle 333-2, representing the range of 10,001 to 20,000 PECs, is in the wear leveling window 331-1 and the rectangle 333-3, representing the range of 20,001 to 30,000 PECs, is in the wear leveling window 331-2. Thus, different groups of memory cells programed using different trims (e.g., have different read windows as described in association with FIG. 4) can be within different wear leveling windows. However, as illustrated by FIG. 3, different groups of memory cells can undergo quantities of PECs within different ranges of PECs, and thus be programed using different trims, but be within the same wear leveling window. For example, the rectangle 333-3, representing the range of 20,001 to 30,000 PECs, and the rectangle 333-4, representing the range of 30,001 to 40,000 PECs, are both within the wear leveling window 331-2.

Because there can be a disconnect between trims which groups of memory cells of a memory device are operated and the granularity of wear leveling windows, calibration of the memory device can be difficult to maintain and difficult to perform on the memory device all at once. Embodiments of the present disclosure overcome this difficulty and improve calibration of a memory device by accounting for the various trims with which groups of memory cells of the memory device are programed. At least one embodiment includes calibrating groups of memory cells that have undergone quantities of PECs within a same range of PECs.

Figure 4:
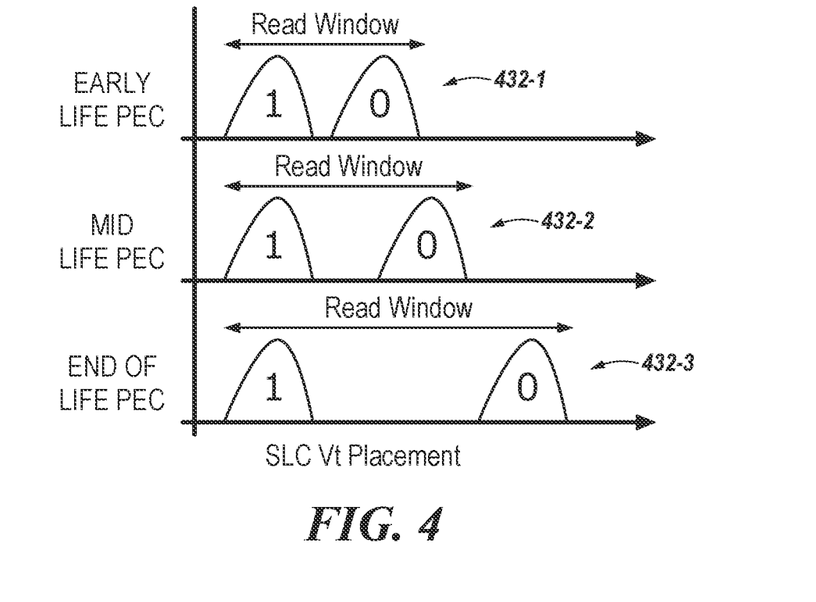
FIG. 4 illustrates different read windows in accordance with some embodiments of the present disclosure.

FIG. 4 illustrates different read windows 432-1, 432-2, and 432-3 in accordance with some embodiments of the present disclosure. The horizontal axis represents the charge or voltage of the memory cell ($V_t$) and the vertical axis represents the quantity of memory cells for each data state (1 and 0) that are programmed to a particular voltage. The curves for each data state (1 and 0) therefore represent statistical distributions of memory cell threshold voltages for each data state. The read windows 432-1, 432-2, and 432-3 are the respective separation between the $V_t$ distributions along the horizontal axis (e.g., in volts). A read window can also be referred to as a read window budget (RWB), a threshold voltage ($V_t$) spread, or a valley width. A valley width refers to a difference in magnitude of different program verify voltages for different programmed states or a program verify voltage and an erase verify voltage for different data states.

Memory cells of a non-volatile memory device can be in good condition early in the service life of the non-volatile memory device. Because the memory cells are in good condition, large valley margins are not required. Thus, the non-volatile memory device can utilize a narrow read window, such as the read window 432-1, without negatively affecting the reliability of the non-volatile memory device. Utilizing a narrow read window can slow down degradation of memory cells of the non-volatile memory device, which, in turn, can increase the endurance and data retention performance of the non-volatile memory device.

FIG. 4 provides a graphical representation of programming a group of memory cells of a non-volatile memory device to a $V_t$ based on a quantity of PECs that the group of memory cells has undergone. For example, early in the service life of the non-volatile memory device, memory cells of the non-volatile memory device can be programmed using trims resulting in the read window 432-1. The read window 432-1 is narrow such that the $V_t$ distribution associated with a data state (e.g., an erased state (1)) is close to the $V_t$ distribution associated with a different data state (e.g., a programmed state (0)). A narrower $V_t$ spread between data states can reduce the data reliability because it can be more difficult to distinguish between the data states. But because the memory cells are in good condition early in the service life of the non-volatile memory device, data states of the memory cells can still be distinguished between even when the read window 432-1 is used.

A benefit of using a narrow read window, such as the read window 420-1, early in the service life of the non-volatile memory device can be reducing memory cell degradation early in the service life of the non-volatile memory device instead of using a wide read window, such as the read window 432-3, throughout the service life of the non-volatile memory device. Programming a memory cell to a greater $V_t$ (and subsequently erasing the memory cell) over many cycles can degrade the memory cell at a faster rate than programming the memory to a lower $V_t$ (and subsequently erasing the memory) early in the service life of the non-volatile memory device and increasing the $V_t$ throughout the service life of the non-volatile memory device in accordance with some embodiments of the present disclosure. Furthermore, although operation of an SLC is generally illustrated in FIG. 4, embodiments are not so limited. The same principles can be applied to memory cells that are operated with more than one programmed state. For example, embodiments of the present disclosure can include programming a memory cell in MLC mode, TLC mode, QLC mode, or PLC mode.

As illustrated by FIG. 4, some embodiments of the present disclosure include increasing the $V_t$ corresponding to the data state 0 as the non-volatile memory device undergoes more PEC. Programming the memory cells to a greater $V_t$ requires a greater voltage and/or increased number of voltage pulses to be applied to the memory cells, which can degrade the materials of the memory cells. During the middle of the service life of the non-volatile memory device, memory cells of the non-volatile memory device can be programmed to a greater $V_t$ corresponding to a desired data state. In response to the non-volatile memory undergoing further PEC, memory cells of the non-volatile memory device can be programmed to a greater $V_t$ corresponding to the data state 0 as illustrated by the read window 432-2. During the latter portion of the service life of the non-volatile memory device, memory cells of the non-volatile memory device can be programmed to an even greater $V_t$ corresponding to a desired data state. In response to the non-volatile memory undergoing even further PEC, memory cells of the non-volatile memory device can be programmed to an even greater $V_t$ corresponding to the data state 0 as illustrated by the read window 432-3. Increasing the read window based on the quantity of PEC that the memory device, block, or cell has undergone (for example, from the read window 432-1 to the read window 432-2 and/or the read window 432-3) in accordance with some embodiments of the present disclosure can be beneficial to improve data retention of the memory device.

Although FIG. 4 illustrates three different read windows 432-1, 432-2, and 432-3, embodiments of the present disclosure are not so limited. FIG. 3 illustrates six ranges of PECs represented by the rectangles 333. Each range of PECs can be associated with different trims that provide six different read windows.

Figure 5:
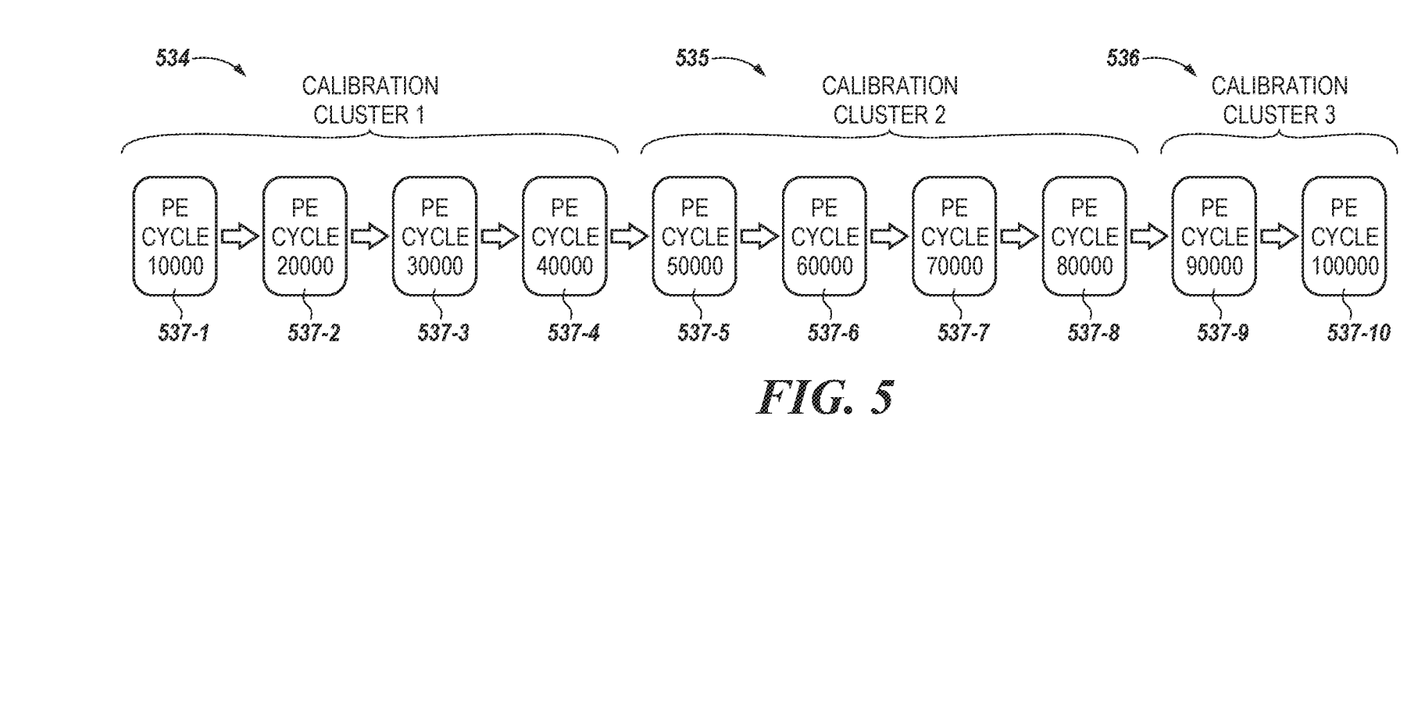
FIG. 5 is a pictorial representation of an example calibration of a non-volatile memory device in accordance with some embodiments of the present disclosure.

FIG. 5 is a pictorial representation of an example calibration of a non-volatile memory device in accordance with some embodiments of the present disclosure. FIG. 5 is described in association with an example method in accordance with some embodiments of the present disclosure illustrated by FIG. 6.

Figure 6:
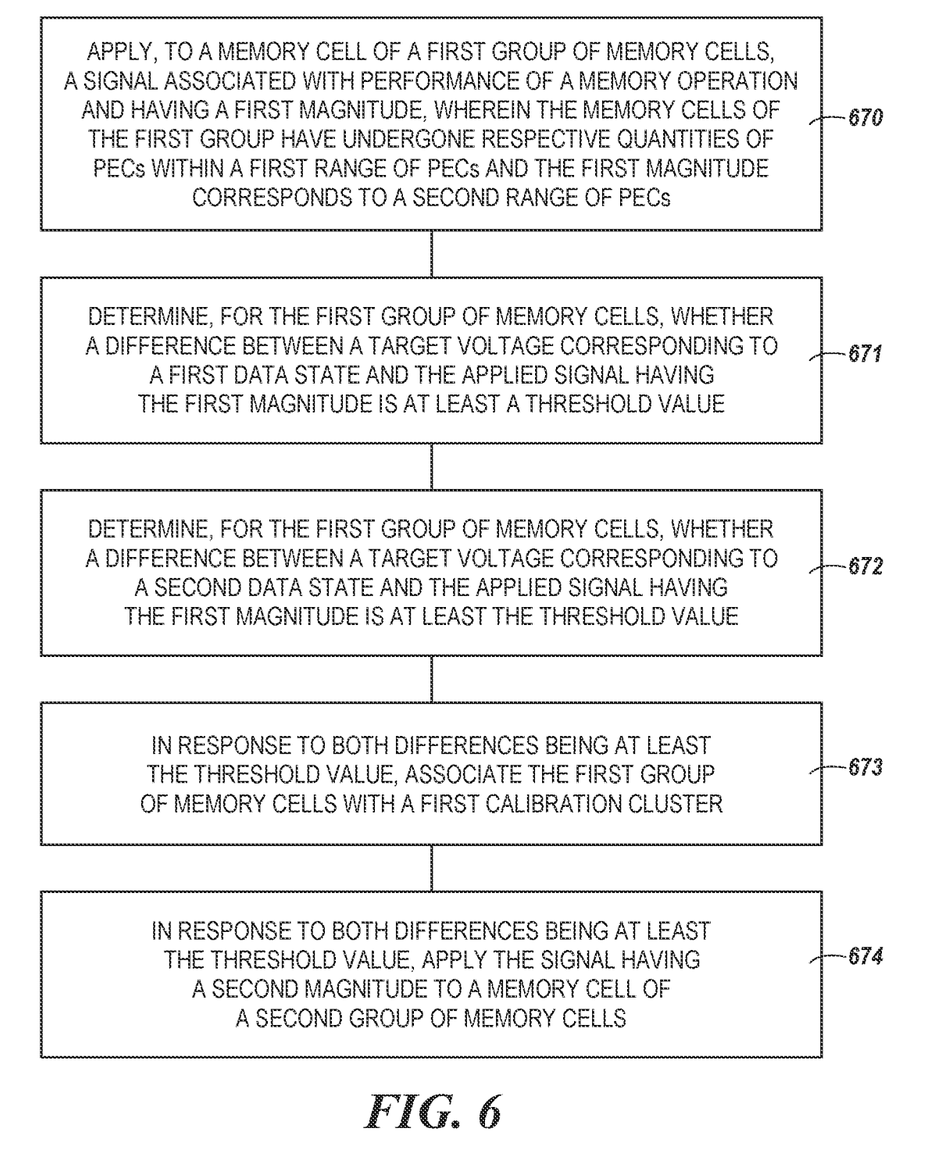
FIG. 6 is a flow diagram of an example method for calibration of a memory device in accordance with some embodiments of the present disclosure.

FIG. 6 is a flow diagram of an example method for calibration of a memory device in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, calibration circuitry 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 670, a signal associated with performance of a memory operation and having a first magnitude, can be applied to a memory cell of a first group of memory cells of a memory device. Memory cells of the first group have undergone respective quantities of PECs within a first range of PECs. FIG. 5 illustrates PEC clusters 537-1, 537-2, 537-3, 537-4, 537-5, 537-6, 537-7, 537-8, 537-9, and 537-10. As used herein, "PEC cluster" refers one or more groups of memory cells that have undergone one or more quantities of PECs with a range of PECs to which a PEC cluster corresponds. In the example of FIG. 5, groups of memory cells that have undergone no more than 10,000 PECs are associated with PEC cluster 537-1. Groups of memory cells that have undergone no more than 20,000 PECs but at least 10,001 PECs are associated with PEC cluster 537-2. Groups of memory cells that have undergone no more than 30,000 PECs but at least 20,001 PECs are associated with PEC cluster 537-3. Groups of memory cells that have undergone no more than 40,000 PECs but at least 30,001 PECS are associated with PEC cluster 537-4. Groups of memory cells that have undergone no more than 50,000 PECs but at least 40,001 PECs are associated with PEC cluster 537-5. Groups of memory cells that have undergone no more than 60,000 PECs but at least 50,001 PECs are associated with PEC cluster 537-6. Groups of memory cells that have undergone no more than 70,000 PECs but at least 60,001 PECs are associated with PEC cluster 537-7. Groups of memory cells that have undergone no more than 80,000 PECs but at least 70,001 PECs are associated with PEC cluster 537-8. Groups of memory cells that have undergone no more than 90,000 PECs but at least 80,001 PECs are associated with PEC cluster 537-9. Groups of memory cells that have undergone no more than 100,000 PECs but at least 90,001 PECs are associated with PEC cluster 537-10.

The first group of memory cells can be associated with the PEC cluster 537-1. At block 670, the example method includes the first magnitude of the signal corresponding to a second range of PECs that is different than the first range of PECs. For example, the second range of PECs can be the range of 10,001 to 20,000 PECs associated with the PEC cluster 537-2.

At operations 671 and 672, a media management operation can be performed on the first group of memory cells. A non-limiting example of a media management operation is a margin check. As used herein, "margin check" refers to an operation performed on a group of memory cells to verify that a magnitude of a signal applied to the memory cells satisfies error handling requirements of a memory device. The signal can be a read signal and the magnitude of a read signal can be referred to as a read level. A margin check can include performing two static reads using predefined read levels. A margin check can include performing two static reads using predefined offsets from a read level associated with the PEC cluster to which the group of memory cells are assigned.

At operation 671, whether a difference between a target voltage corresponding to a first data state and the applied signal having the first magnitude is at least a threshold value can be determined for the first group of memory cells. At operation 672, whether a difference between a target voltage corresponding to a second data state and the applied signal having the first magnitude is at least the threshold value can be determined for the first group of memory cells.

At operation 673, in response to determining that both differences are at least the threshold value, the first group of memory cells can be associated with a first calibration cluster. As used herein, "calibration cluster" refers to one or more groups of memory cells that utilize a same read level. FIG. 5 illustrates three calibration clusters 534, 535, and 536. If a margin check performed on a group of memory cells associated with the PEC cluster 537-1, such as the first group of memory cells, based on a read level corresponding to the PEC cluster 537-2 is indicative of the differences being at least the threshold value (i.e., a successful margin check), then the PEC cluster 537-1 and the groups of memory cells associated therewith are associated with the calibration cluster 534.

At operation 674, in response to determining that both differences are at least the threshold value, the signal having a second magnitude can be applied to a memory cell of a second group of memory cells of the memory device. Memory cells of the second group have undergone respective quantities of PECs within the second range of PECs described in association with block 670. The second magnitude corresponds to a third range of PECs different than the second range of PECs. For example, the third range of PECs can be the range of 20,001 to 30,000 PECs associated with the PEC cluster 537-3.

Although not specifically illustrated, the method can include, determining, for the second group of memory cells, whether a difference between a target voltage corresponding to the first data state and the applied signal having the second magnitude is at least the threshold value. The method includes determining, for the second group of memory cells, whether a difference between a target voltage corresponding to the second data state and the applied signal is at least the threshold value. The method can include, in response to determining that both differences are at least the threshold value, associating the second group of memory cells with the first calibration cluster. If a margin check performed on a group of memory cells associated with the PEC cluster 537-2, such as the second group of memory cells, based on a read level corresponding to the PEC cluster 537-2 is indicative of the differences being at least the threshold value (i.e., a successful margin check), then the PEC cluster 537-2 and the groups of memory cells associated therewith are associated with the calibration cluster 534 as illustrated by FIG. 5.

The method can further include applying the signal having a third magnitude to a memory cell of a third group of memory cells of the memory device. Memory cells of the third group have undergone respective quantities of PECs within the third range of PECs. The third magnitude corresponds to a fourth range of PECs different from the third range of PECs. For example, the fourth range of PECs can be the range of 30,001 to 40,000 PECs associated with the PEC cluster 537-4.

Although not specifically illustrated, the method can include, in response to determining, for the first group of memory cells, that one or both of the differences is less than the threshold value, associating the first group of memory cells with a second calibration cluster. The method can further include designating the second calibration cluster as a primary calibration cluster. As used herein, "primary calibration cluster" refers to a calibration cluster to which the read level is used for calibration of the memory device. The method can further include designating the second calibration cluster as the primary calibration cluster in response to a greater quantity of groups of memory cells of the memory device being associated with the second calibration cluster than the first calibration cluster. If a same quantity of groups of memory cells of the memory device is associated with the first and second calibration clusters, then the method can include designating the second calibration cluster as the primary calibration cluster in response to groups of memory cells of the memory device that have undergone greater quantities of PECs being associated with the second calibration cluster than the first calibration cluster.

In the example illustrated by FIG. 5, a margin check is performed on memory cells associated with the PEC cluster 537-1 using a read level corresponding to the PEC cluster 537-2. Because the margin check was successful, the PEC cluster 537-1, and groups of memory cells associated therewith, are associated with the calibration cluster 534. Subsequently, a margin check is performed on memory cells associated with the PEC cluster 537-2 using a read level corresponding to the PEC cluster 537-3. Because the margin check was successful, the PEC cluster 537-2, and groups of memory cells associated therewith, are associated with the calibration cluster 534. Subsequently, a margin check is performed on memory cells associated with the PEC cluster 537-3 using a read level corresponding to the PEC cluster 537-4. Because the margin check was successful, the PEC cluster 537-3, and groups of memory cells associated therewith, are associated with the calibration cluster 534. Subsequently, a margin check is performed on memory cells associated with the PEC cluster 537-4 using a read level corresponding to the PEC cluster 537-5. Because the margin check was successful, the PEC cluster 537-4, and groups of memory cells associated therewith, are associated with the calibration cluster 534.

A margin check is performed on memory cells associated with the PEC cluster 537-5 using a read level corresponding to the PEC cluster 537-6. However, the margin check is unsuccessful. As a result, a new calibration cluster 535 is created and the PEC cluster 537-5, and groups of memory cells associated therewith, are associated with the calibration cluster 534. The calibration cluster 534 is the primary calibration cluster because there are more PEC clusters associated with the calibration cluster 534 than the calibration cluster 535.

Subsequently, a margin check is performed on memory cells associated with the PEC cluster 537-6 using a read level corresponding to the PEC cluster 537-7. Because the margin check was successful, the PEC cluster 537-6, and groups of memory cells associated therewith, are associated with the calibration cluster 535. Subsequently, a margin check is performed on memory cells associated with the PEC cluster 537-7 using a read level corresponding to the PEC cluster 537-8. Because the margin check was successful, the PEC cluster 537-7, and groups of memory cells associated therewith, are also associated with the calibration cluster 535. Subsequently, a margin check is performed on memory cells associated with the PEC cluster 537-8 using a read level corresponding to the PEC cluster 537-9. Because the margin check was successful, the PEC cluster 537-8, and groups of memory cells associated therewith, are also associated with the calibration cluster 535. The calibration cluster 535 becomes the primary calibration cluster with the addition of the PEC cluster 537-8 because the calibration clusters 534 and 535 each have four PEC clusters associated therewith, but groups of memory cells associated with the PEC clusters 537-5, 537-6, 537-7, and 537-8 have undergone greater quantities of PECs.

A margin check is performed on memory cells associated with the PEC cluster 537-9 using a read level corresponding to the PEC cluster 537-10. However, the margin check is unsuccessful. As a result, a new calibration cluster 536 is created and the PEC cluster 537-9, and groups of memory cells associated therewith, are associated with the calibration cluster 536. Subsequently, a margin check is performed on memory cells associated with the PEC cluster 537-10 using a read level corresponding to a different PEC cluster (not shown). Because the margin check was successful, the PEC cluster 537-10, and groups of memory cells associated therewith, are associated with the calibration cluster 536. The calibration cluster 535 remains as the primary calibration cluster because there are more PEC clusters associated with the calibration cluster 535 than the calibration cluster 536.

Figure 7:
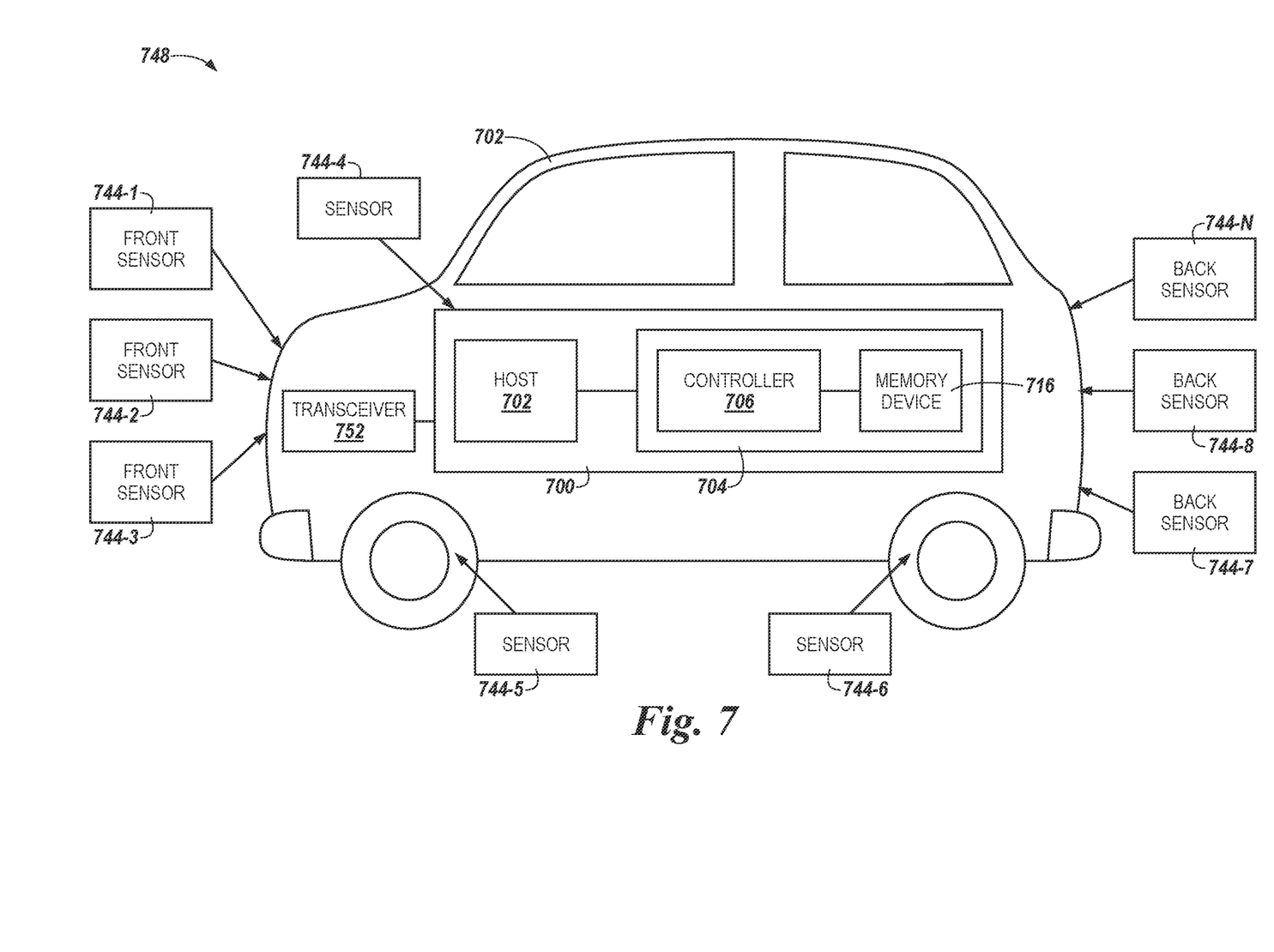
FIG. 7 illustrates an example of a system including a computing system in a vehicle in accordance with some embodiments of the present disclosure.

FIG. 7 illustrates an example of a system 748 including a computing system 700 in a vehicle 755 in accordance with some embodiments of the present disclosure. The computing system 700 can include a memory sub-system 704, which is illustrated as including a controller 706 and non-volatile memory device 716 for simplicity but is analogous to the memory sub-system 104 illustrated in FIG. 1. The computing system 700, and thus the host 702, can be coupled to one or more sensors 744-1, 744-2, 744-3, 744-4, 744-5, 744-6, 744-7, 744-8, . . . , 744-N either directly, as illustrated for the sensor 752-4 or via a transceiver 752 as illustrated for the sensors 744-1, 744-2, and 744-3. The transceiver 852 is able to receive time based telemetric sensor data from the sensors 744 wirelessly, such as by radio frequency communication.

In at least one embodiment, each of the sensors 744 can communicate with the computing system 700 wirelessly via the transceiver 744. In at least one embodiment, each of the sensors 744 is connected directly to the computing system 700 (e.g., via wires or optical cables). As used herein, telemetric sensor data means that the data is collected by the sensors 744 that are remote from the memory sub-system 704 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 755 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 744 are illustrated in FIG. 7 as including example attributes. For example, the sensors 744-1, 744-2, and 744-3 are camera sensors collecting data from the front of the vehicle 755. The sensors 744-4, 744-5, and 744-8 are microphone sensors collecting data from the from the front, middle, and back of the vehicle 755. The sensors 744-7, 744-8, and 744-N are camera sensors collecting data from the back of the vehicle 755. As another example, the sensors 744-5 and 744-6 are tire pressure sensors. As another example, the sensor 744-4 is a navigation sensor, such as a global positioning system (GPS) receiver. As another example, the sensor 744-6 is a speedometer. As another example, the sensor 744-4 represents one or more engine sensors such as a temperature sensor, a pressure sensor, a voltmeter, an ammeter, a tachometer, a fuel gauge, etc. As another example, the sensor 744-4 represents a video camera.

The host 702 can execute instructions to provide an overall control system and/or operating system for the vehicle 755. The host 702 can be a controller designed to assist in automation endeavors of the vehicle 755. For example, the host 702 can be an advanced driver assistance system controller (ADAS). An ADAS can monitor data to prevent accidents and provide warning of potentially unsafe situations. For example, the ADAS can monitor sensors in the vehicle 755 and take control of vehicle 755 operations to avoid accident or injury (e.g., to avoid accidents in the case of an incapacitated user of a vehicle). The host 702 may need to act and make decisions quickly to avoid accidents. The memory sub-system 704 can store reference data in the non-volatile memory device 716 such that time based telemetric sensor data from the sensors 744 can be compared to the reference data by the host 702 in order to make quick decisions.

Figure 8:
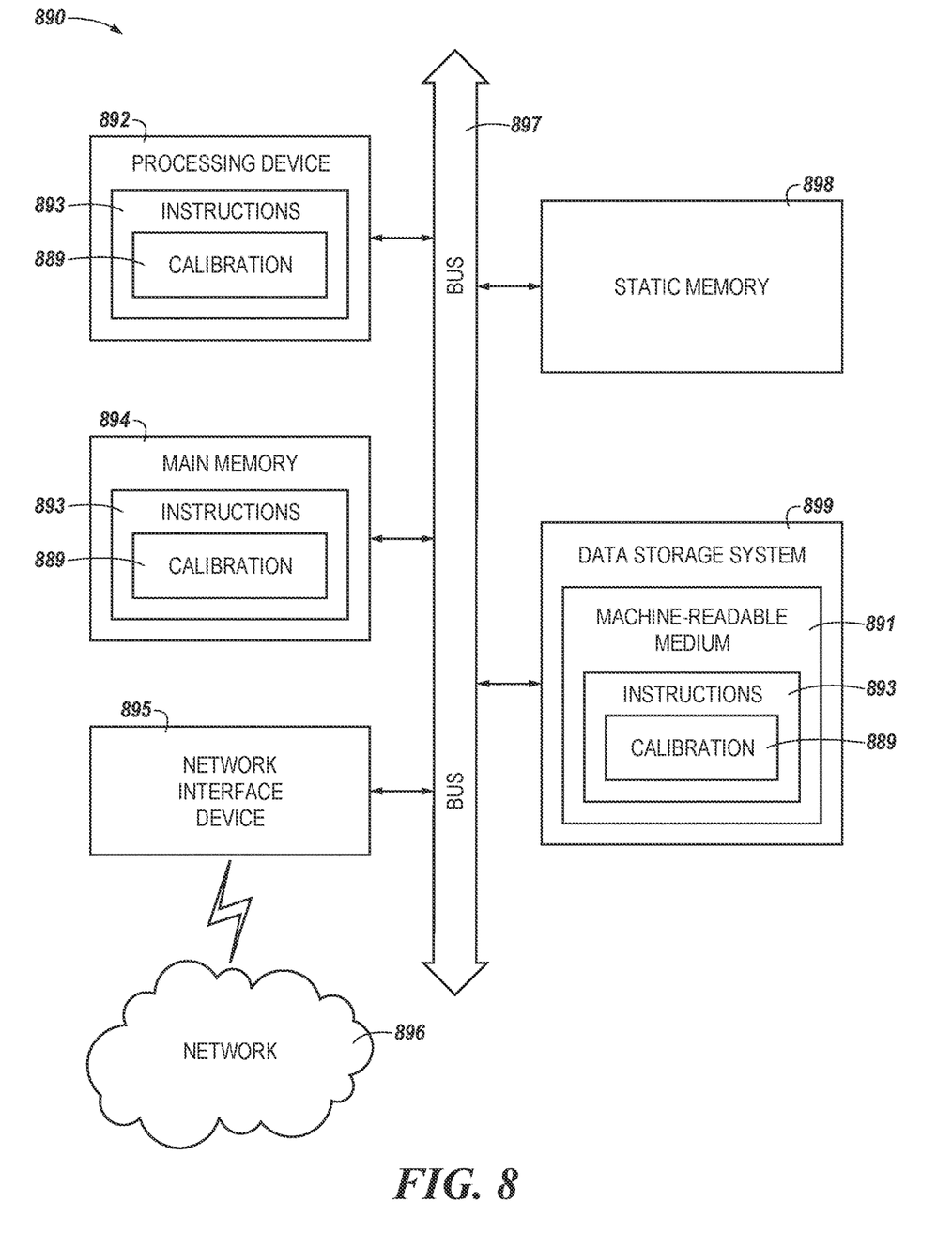
FIG. 8 is a block diagram of an example computer system in which embodiments of the present disclosure can operate.

FIG. 8 is a block diagram of an example computer system in which embodiments of the present disclosure can operate. Within the computer system 890, a set of instructions, for causing a machine to perform one or more of the methodologies discussed herein, can be executed. The computer system 890 includes a processing device 892, a main memory 894, a static memory 898 (e.g., flash memory, static random access memory (SRAM), etc.), and a data storage system 899, which communicate with each other via a bus 897. The data storage system 899 is analogous to the memory sub-system 104 illustrated in FIG. 1.

The processing device 892 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 892 can also be one or more special-purpose processing devices such as an ASIC, an FPGA, a digital signal processor (DSP), network processor, or the like. The processing device 892 is configured to execute instructions 893 for performing the operations and steps discussed herein. The computer system 890 can further include a network interface device 895 to communicate over a network 896.

The data storage system 899 can include a machine-readable storage medium 891 (also known as a computer-readable medium) on which is stored one or more sets of instructions 893 or software embodying one or more of the methodologies or functions described herein. The instructions 893 can also reside, completely or at least partially, within the main memory 894 and/or within the processing device 892 during execution thereof by the computer system 890, the main memory 894 and the processing device 892 also constituting machine-readable storage media.

In some embodiments, the instructions 893 can be executed to implement functionality corresponding to the calibration circuitry 112 of FIG. 1. The instructions 893 can be executed to perform a media management operation on groups of memory cells of a memory device using respective read voltages. The respective read voltages can be based on a respective quantity of PECs that each respective group of memory cells has undergone. The instructions 893 can be executed to, responsive to a unsuccessful result of the media management operation, perform the media management operation on one or more of the groups of memory cells using the read voltage that yielded a last successful result of the media management operation, irrespective of a quantity of PECs undergone by the one or more groups of memory cells.

In some embodiments, the instructions 893 can be executed to perform the media management operation according to a sequence based on the respective quantities of PECs undergone by each respective group of memory cells. The instructions 893 can be executed to, responsive to another unsuccessful result of the media management operation subsequent to the unsuccessful result, perform the media management operation on another one of the groups of memory cells using the read voltage that yielded a last successful result of the media management operation, irrespective of a quantity of PECs that the other group of memory cells has undergone.

In some embodiments, the instructions 893 can be executed to perform the media management operation on groups of memory cells of the memory device throughout a service life of the memory device. Magnitudes of the read voltages can be based on a remaining portion of the service life of the memory device.

While the machine-readable storage medium 891 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, ROMs, RAMs, EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a processing device; and
a memory device communicatively coupled to the processing device, wherein the processing device is configured to:
perform, using a first voltage, a media management operation on a first group of memory cells of the memory device, wherein the first group has undergone quantities of program/erase cycles (PECs) within a first range of PECs and a magnitude of the first voltage corresponds to a second range of PECs exceeding the first range of PECs;
responsive to a first result of the media management operation on the first group of memory cells, perform, using a second voltage, the media management operation on a second group of memory cells of the memory device, wherein the second group has undergone quantities of PECs within the second range of PECs and a magnitude of the second voltage corresponds to a third range of PECs exceeding the second range of PECs; and
responsive to a second result of the media management operation on the first group of memory cells, perform, using the first voltage, the media management operation on the second group of memory cells.

2. The system of claim 1, wherein:
a boundary of the first range of PECs is zero PECs, and the processing device is configured to:
responsive to a first result of the media management operation on the second group of memory cells, perform, using a third voltage, the media management operation on a third group of memory cells of the memory device, wherein the third group has undergone quantities of PECs within the third range of PECs and a magnitude of the third voltage corresponds to a fourth range of PECs exceeding the third range of PECs; and
responsive to a second result of the media management operation on the second group of memory cells, perform, using the second voltage, the media management operation the third group of memory cells.

3. The system of claim 2, wherein the processing device is configured to, subsequent to performance of the media management operation on at least one of the first, second, and third groups of memory cells, perform, using a fourth voltage, the media management operation on a fourth group of memory cells of the memory device, wherein the fourth group has undergone quantities of PECs within the first range of PECs.

4. The system of claim 3, wherein the first voltage is associated with a different trim than the fourth voltage.

5. The system of claim 1, wherein:
the memory device comprises a cyclic buffer portion and a snapshot portion comprising the first group of memory cells and the second group of memory cells, and
the first range of PECs is 0 to 10,000 PECs and at least one memory cell of the snapshot portion has undergone greater than 90,000 PECs.

6. The system of claim 5, wherein:
at least one first memory cell of the snapshot portion is programmed using a first trim,
at least one second memory cell of the snapshot portion is programmed using a second trim,
the at least one first memory cell has undergone fewer than 10,000 PECs, and
the at least one second memory cell has undergone greater than 90,000 PECs.

7. The system of claim 1, wherein the system comprises a solid state drive to provide event recorder storage for an autonomous vehicle.

8. An autonomous vehicle, comprising:
a memory device comprising groups of memory cells; and
a processing device coupled to the memory device, wherein the processing device is configured to:
perform, using a first voltage, a media management operation on a first group of memory cells of the memory device, wherein the first group has undergone quantities of program/erase cycles (PECs) within a first range of PECs and the first voltage corresponds to a second range of PECs exceeding the first range of PECs;
responsive to a first result of the media management operation on the first group of memory cells, perform, using a second voltage, the media management operation on a second group of memory cells of the memory device, wherein the second group has undergone quantities of PECs within the second range of PECs and the second voltage corresponds to a third range of PECs exceeding the second range of PECs; and
responsive to a second result of the media management operation on the first group of memory cells, perform, using the first voltage, the media management operation on the second group of memory cells.

9. The autonomous vehicle of claim 8, wherein:
the memory device comprises a cyclic buffer portion and a snapshot portion comprising the first group of memory cells and the second group of memory cells, and
the first range of PECs is 0 to 10,000 PECs and at least one memory cell of the snapshot portion has undergone greater than 90,000 PECs.

10. The autonomous vehicle of claim 8, wherein the processing device is configured to:
responsive to a first result of the media management operation on the second group of memory cells, perform, using a third voltage, the media management operation on a third group of memory cells of the memory device, wherein the third group has undergone quantities of PECs within the third range of PECs and a magnitude of the third voltage corresponds to a fourth range of PECs exceeding the third range of PECs; and
responsive to a second result of the media management operation on the second group of memory cells, perform the media management operation on the third group of memory cells using the second voltage.

11. The autonomous vehicle of claim 8, wherein the memory device provides event recorder storage for the autonomous vehicle.

\* \* \* \* \*